(12) United States Patent
Wu

(10) Patent No.: US 11,910,621 B2
(45) Date of Patent: Feb. 20, 2024

(54) MEMORY DEVICE AND MANUFACTURING METHOD THEREOF

(71) Applicant: TAIWAN SEMICONDUCTOR MANUFACTURING CO., LTD., Hsinchu (TW)

(72) Inventor: Jau-Yi Wu, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/283,455

(22) Filed: Feb. 22, 2019

(65) Prior Publication Data
US 2020/0273910 A1 Aug. 27, 2020

(51) Int. Cl.
| | | |
|---|---|---|
| H10N 50/01 | (2023.01) | |
| H10B 63/00 | (2023.01) | |
| H10B 61/00 | (2023.01) | |
| H10N 70/20 | (2023.01) | |
| H10N 70/00 | (2023.01) | |
| H01F 10/32 | (2006.01) | |
| H10N 50/80 | (2023.01) | |
| H10N 50/85 | (2023.01) | |

(52) U.S. Cl.
CPC ............ *H10B 63/24* (2023.02); *H10B 61/10* (2023.02); *H10N 50/01* (2023.02); *H10N 70/063* (2023.02); *H10N 70/066* (2023.02); *H10N 70/231* (2023.02); *H10N 70/24* (2023.02); *H10N 70/826* (2023.02); *H10N 70/841* (2023.02); *H01F 10/3254* (2013.01); *H10N 50/80* (2023.02); *H10N 50/85* (2023.02); *H10N 70/8825* (2023.02); *H10N 70/8828* (2023.02); *H10N 70/8833* (2023.02)

(58) Field of Classification Search
CPC .... H01L 27/2427; H01L 27/224; H01L 43/12
See application file for complete search history.

(56) References Cited

U.S. PATENT DOCUMENTS

| | | | | |
|---|---|---|---|---|
| 10,147,876 | B1* | 12/2018 | Huang | H01L 45/16 |
| 2005/0127347 | A1* | 6/2005 | Choi | H01L 21/7684 |
| | | | | 257/2 |
| 2010/0163825 | A1* | 7/2010 | Dennison | H01L 45/06 |
| | | | | 257/3 |
| 2014/0349413 | A1* | 11/2014 | Chung | H01L 43/12 |
| | | | | 438/3 |
| 2015/0262864 | A1* | 9/2015 | Okamoto | H01L 21/31116 |
| | | | | 438/671 |
| 2016/0005963 | A1* | 1/2016 | Kim | G06F 3/0679 |
| | | | | 710/57 |
| 2016/0064385 | A1* | 3/2016 | Chang | H01L 28/60 |
| | | | | 438/387 |
| 2017/0194558 | A1* | 7/2017 | Lee | H01L 43/10 |
| 2019/0157346 | A1* | 5/2019 | Lee | H01L 45/16 |

OTHER PUBLICATIONS

U.S. Appl. No. 15/885,001, filed Jan. 31, 2018.

* cited by examiner

*Primary Examiner* — Trang Q Tran
(74) *Attorney, Agent, or Firm* — Maschoff Brennan

(57) ABSTRACT

A method for manufacturing a memory device includes forming a dielectric layer over a substrate. A bottom electrode via opening is formed in the dielectric layer. A bottom electrode is formed in the bottom electrode via opening. The bottom electrode is etched back. A selector is formed in the bottom electrode via opening and over the bottom electrode. A memory layer is formed over the selector. A top electrode is formed over the memory layer.

20 Claims, 18 Drawing Sheets

MEMORY DEVICE AND MANUFACTURING METHOD THEREOF

BACKGROUND

Memory devices are used to store information in semiconductor devices and systems. The popular dynamic random access memory (DRAM) cell includes a switch and a capacitor. DRAMs are highly integrated and fast memory devices, but they do not retain data when power is cut off.

On the other hand, a nonvolatile memory device is capable of retaining data even after power is cut off. Examples of nonvolatile memory devices include the flash memory, magnetic random access memories (MRAMs), resistive random access memories (RRAMs) and phase-change random access memories (PCRAMs). MRAMs store data using variations in the magnetization direction at tunnel junctions. PCRAMs store data using resistance variations caused by phase changes of specific materials. RRAMs store data by changes in electric resistance, not by changes in charge capacity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
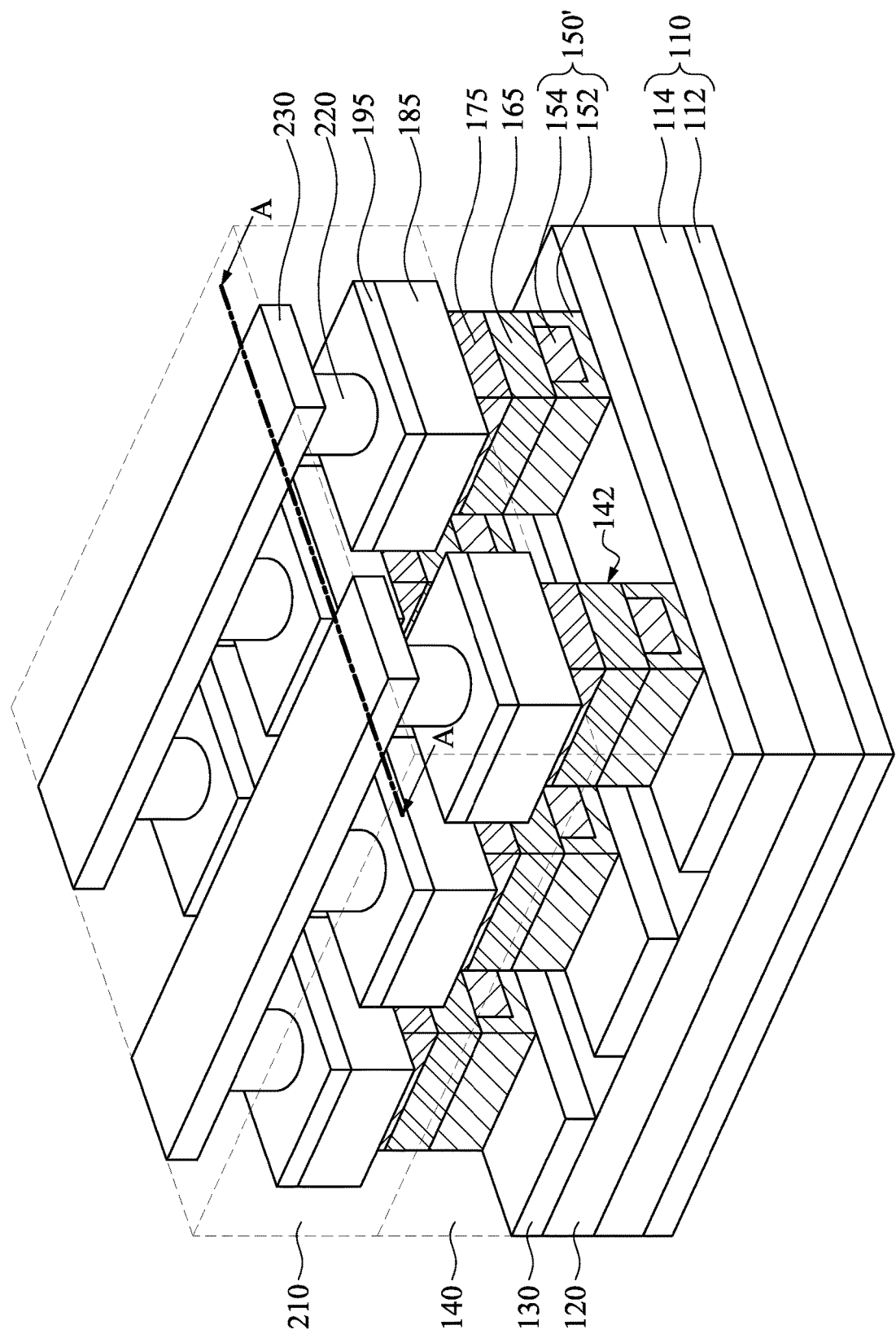
FIG. 1 is a perspective view of a memory device in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated.

This disclosure relates to integrated memory fabrications and more specifically to one selector one memory formations by forming the selector in a via structure. Because of the selector formed in via, an integrated memory device with a small sized selector can be formed. For example, a width of the memory layer may be different from a width of the selector, e.g., greater than the width of the selector. Such structure and its method does not add area burden to the device and thus enhances an efficient use of substrate area for higher density devices.

FIG. 1 is a perspective view of a memory device in accordance with various embodiments of the present disclosure. The memory device includes a first dielectric layer 140, a bottom electrode 150', a selector 165, a memory layer 185, and a top electrode 195. The first dielectric layer 140, represented by dashed lines for clarity, surrounds the bottom electrode 150' and the selector 165. The selector 165 is over the bottom electrode 150', the memory layer 185 is over the bottom electrode 150', and the top electrode 195 is over the memory layer 185. In some embodiments, the memory device further includes a capping layer 175 between the memory layer 185 and the selector 165. The first dielectric layer 140 also surrounds the capping layer 175. Since the selector 165 is in a bottom electrode via opening 142 of the first dielectric layer 140, the selector 165 has a small size. Also, the first dielectric layer 140, which is made of an insulating material, surrounds the selector 165, the heat generated by the selector 165 is confined therein and does not easy to be dissipated by the first dielectric layer 140, such that the threshold voltage for the memory operation can be reduced.

In FIG. 1, the bottom electrode 150', the selector 165, the memory layer 185, and the top electrode 195 form a one selector-one memory configuration. A set of the one selector-one memory configuration is referred to as a memory cell. The selector 165 facilitates the selection of a desired memory cell. In FIG. 1, the memory device includes six memory cells arranged as an array. If the memory is a resistive random access memory (RRAM), then the bottom electrode 150', the selector 165, the memory layer 185, and the top electrode 195 form a one selector-one resistor (1S1R) configuration. In some other embodiments, the memory may be a phase change random access memory (PCRAM) or a magneto-resistive random access memory (MRAM).

In FIG. 1, the memory cells are formed over a wafer 110 including a substrate 112 and a logic circuit 114 formed over the substrate 112. That is, the memory cells are formed in the logic region of the wafer 110. As such, a memory region may be omitted, and the present disclosure is not limited in this respect. Furthermore, one or more inter-metal dielectric (IMD) layer 120 may be formed between the wafer 110 and the memory cells. The IMD 120 may be an interconnection between the logic circuit 114 and the memory cells.

Moreover, the memory device further includes bottom conductive lines 130 and top conductive lines 230. The bottom conductive lines 130 are arranged in a first direction and are connected to the bottom electrodes 150'. The top conductive lines 230 are arranged in a second direction different from the first direction and are connected to the top electrodes 195 through top vias 220. In some embodiments, the first direction is substantially perpendicular to the second direction. The memory device further includes a second dielectric layer 210 (represented by dashed lines for clarity) over the first dielectric layer 140 and surrounding the memory layers 185, the top electrodes 195, the top vias 220, and the top conductive lines 230.

Figure 2A:
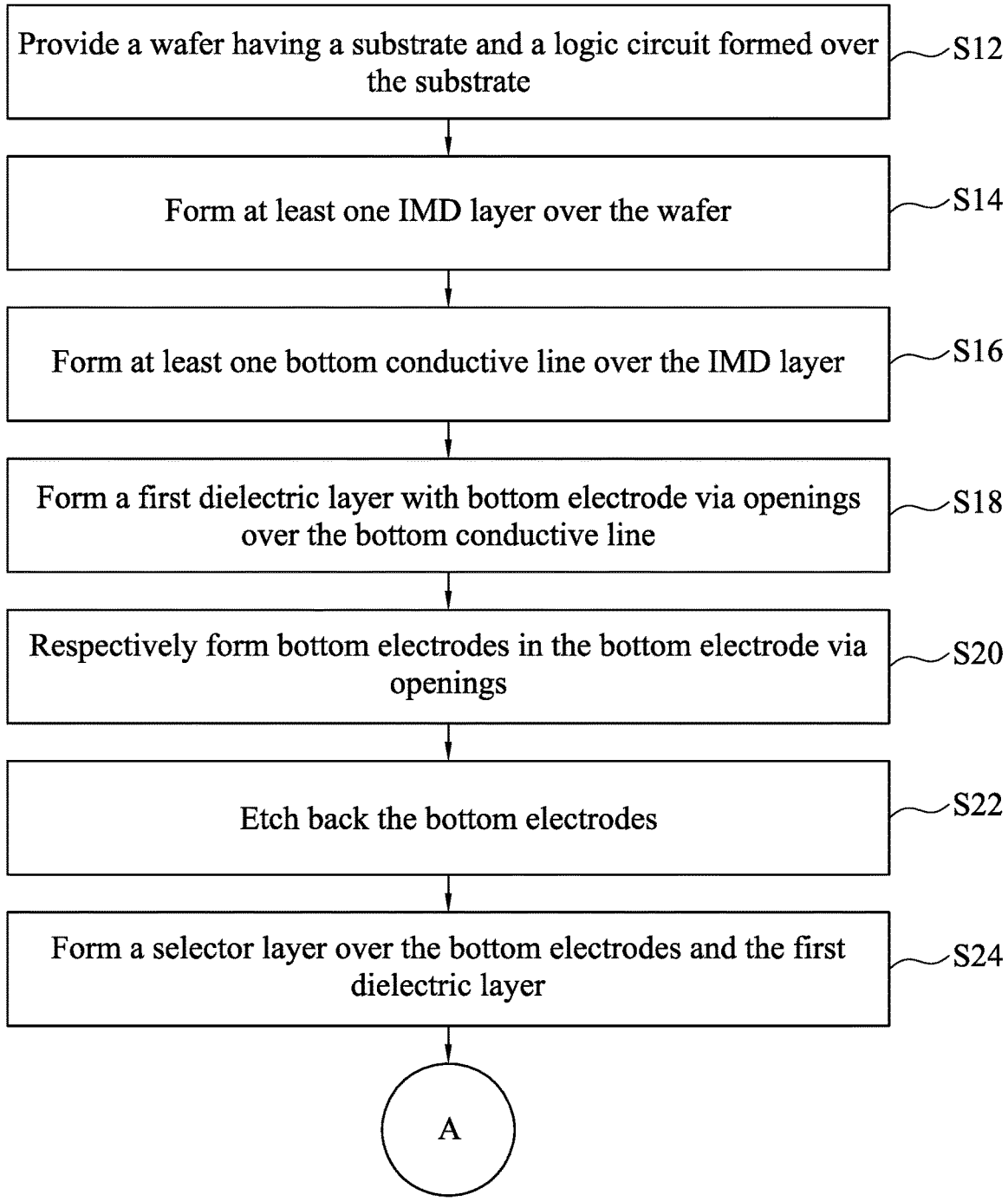
FIGS. 2A and 2B are a flowchart of a method for making a memory device according to aspects of the present disclosure in various embodiments.
Figure 2B:
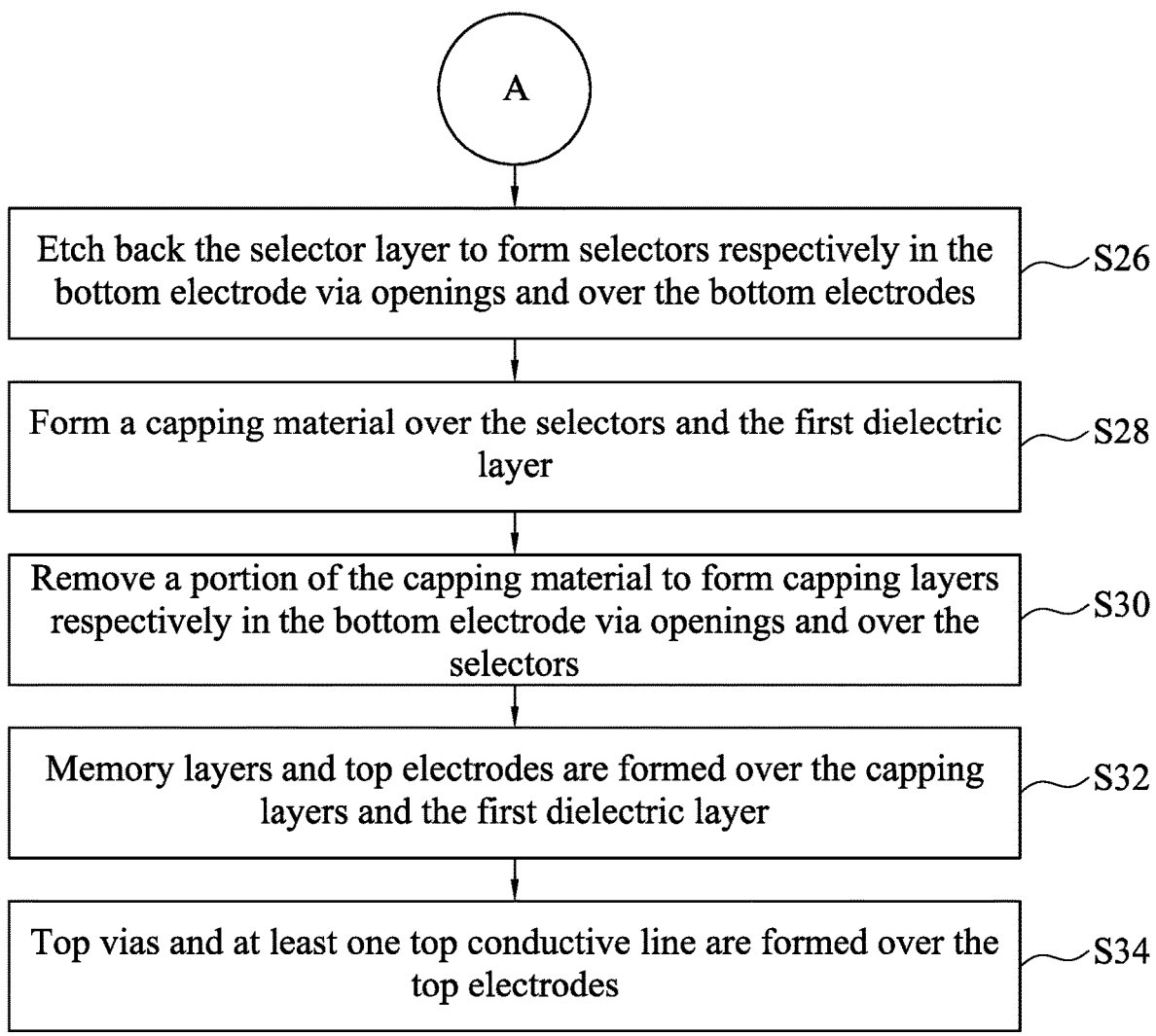
Figure 3:
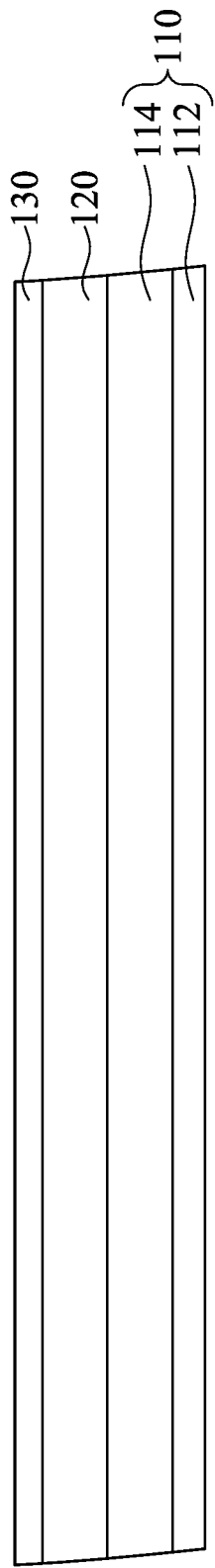
FIGS. 3-14 illustrate cross-sectional views along Y direction corresponding to lines A-A illustrated in FIG. 1.

FIGS. 2A and 2B are a flowchart of a method M10 for making a memory device according to aspects of the present disclosure in various embodiments. Various operations of the method M10 are discussed in association with cross-section diagrams FIGS. 3-14, where illustrate cross-sectional views along Y direction corresponding to lines A-A illustrated in FIG. 1. Throughout the various views and illustrative embodiments, like reference numbers are used to designate like elements. In operation S12 of method M10, a wafer 110 having a substrate 112 and a logic circuit 114 formed over the substrate 112 is provided, as shown in FIG. 3. The substrate 112 may be a silicon substrate. Alternatively, the substrate 112 may include another elementary semiconductor, such as germanium; a compound semiconductor including silicon carbide; an alloy semiconductor including silicon germanium; or combinations thereof. In some embodiments, the substrate 112 is a semiconductor on insulator (SOI) substrate. The substrate 112 may include doped regions, such as p-wells and n-wells. In some embodiments, the wafer 110 is a workpiece that includes the substrate 112 and various features formed in and over and attached to the substrate 112. In some embodiments, the logic circuit 114 includes transistors formed by transistor fabrication processes and may be a planar transistor, such as polysilicon gate transistors or high-k metal gate transistors, or a multi-gate transistor, such as fin field effect transistors. After the transistors are formed, one or more metal/dielectric layers of a multi-level interconnect (MLI) is formed over the transistors. According to some embodiments, plural metal/dielectric layers are formed over the transistors.

In operation S14 of method M10 in FIG. 2A, at least one IMD layer 120 is formed over the wafer 110, as shown in FIG. 3. The IMD layer 120 may provide electrical interconnection between the memory cells and the logic circuit 114 as well as structural support for the various features of the memory device during many fabrication process operations, some of which will be discussed herein. For example, the IMD layer 120 can act as structural support for memory cells formed thereon. Specifically, the memory cells are formed over the IMD layer 120 as shown in FIG. 1. In some embodiments, the IMD layer 120 may be silicon oxide, low-k silicon oxide such as a porous silicon oxide layer, other suitable interlayer dielectric (ILD) material, other suitable inter-metal dielectric material, combinations thereof, or the like. In some embodiments, the IMD layer 120 is a low-k dielectric layer made from extra low-k materials, extreme low-k materials, combinations thereof, or the like. In some embodiments, the IMD layer 120 may have a dielectric constant lower than 2.4. In some embodiments, the IMD layer 120 is made using diethoxymethylsilane (mDEOS) or the like as a precursor gas in a chemical vapor deposition (CVD) process. However, other low-k dielectric materials may be used as well. The IMD layer 120 also includes conductive elements for interconnecting the memory cells and the logic circuit 114.

In operation S16 of method M10 in FIG. 2A, at least one bottom conductive line 130 is formed over the IMD layer 120, as shown in FIG. 3. In some embodiments, the bottom conductive line 130 is formed of copper or copper alloys. In some other embodiments, the bottom conductive line 130 may be formed of conductive materials such as aluminum, tungsten, carbon, TaN, or other suitable materials. In still some other embodiments, the bottom conductive line 130 may be a bilayer structure (e.g., a TaN layer and a TiN layer formed on the TaN layer). In some embodiments, a blanket conductive layer may be formed on the IMD layer 120 in advance, and then the blanket conductive layer is patterned to be a plurality of the bottom conductive line 130. In FIGS. 1 and 3, the bottom conductive line 130 extends in the Y direction.

Figure 4:
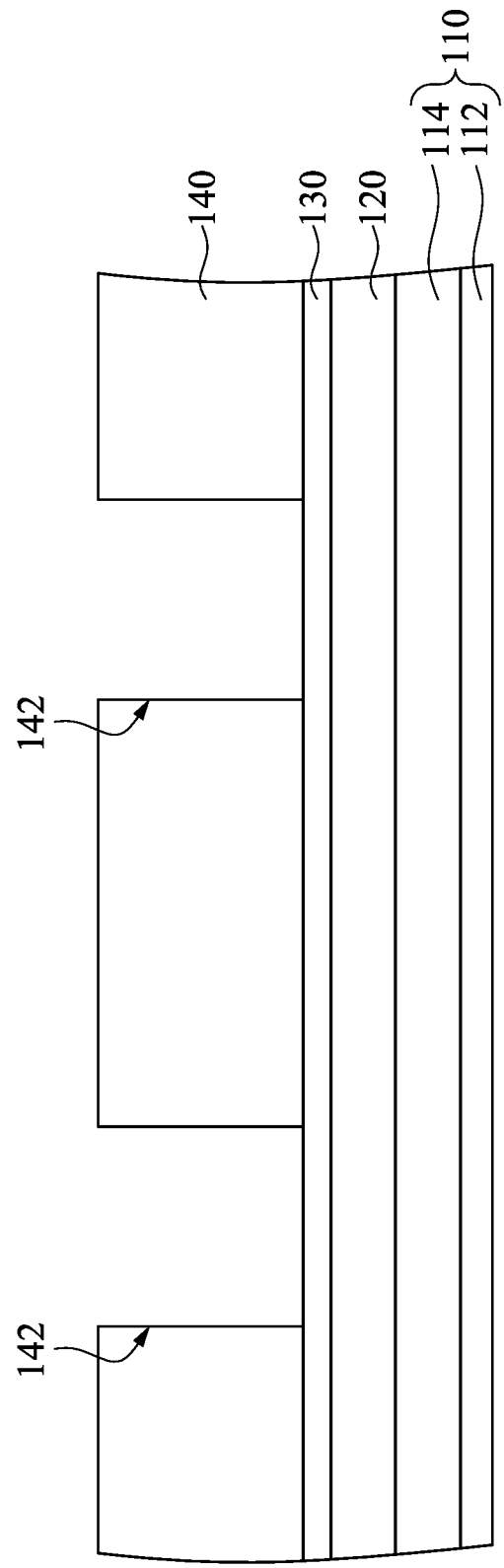

In operation S18 of method M10 in FIG. 2A, a first dielectric layer 140 with bottom electrode via openings 142 formed therein is formed over the bottom conductive line 130 and the IMD layer 120, as shown in FIG. 4. The bottom electrode via openings 142 exposes the bottom conductive line 130. In some embodiments, the first dielectric layer 140 may include, for example, silicon oxide, low-k silicon oxide such as a porous silicon oxide layer, other suitable dielectric material, combinations thereof, or the like. The first dielectric layer 140 is deposited over the bottom conductive line 130 and the IMD layer 120. Plural bottom electrode via openings 142 are formed in the first dielectric layer 140. The bottom electrode via openings 142 extends from a top surface of the first dielectric layer 140 to the bottom conductive line 130. In some embodiments, a depth D1 of the bottom electrode via opening 142 (i.e., the thickness of the first dielectric layer 140) is in a range of about 30 nm to about 100 nm. If the depth D1 is less than about 30 nm, the bottom electrode via opening 142 may not have sufficient space to form the bottom electrode 150 (see FIG. 1), the selector 165 (see FIG. 1), and the capping layer 175 (see FIG. 1). If the depth D1 is greater than about 100 nm, the bottom electrode via opening 142 may be a high aspect ratio hole, and the bottom electrode 150, the selector 165, and the capping layer 175 are not easy to fill the bottom electrode via opening 142. Otherwise, the width of the bottom electrode via opening 142 may be increased to reduce the aspect ratio of the bottom electrode via opening 142.

Figure 5:
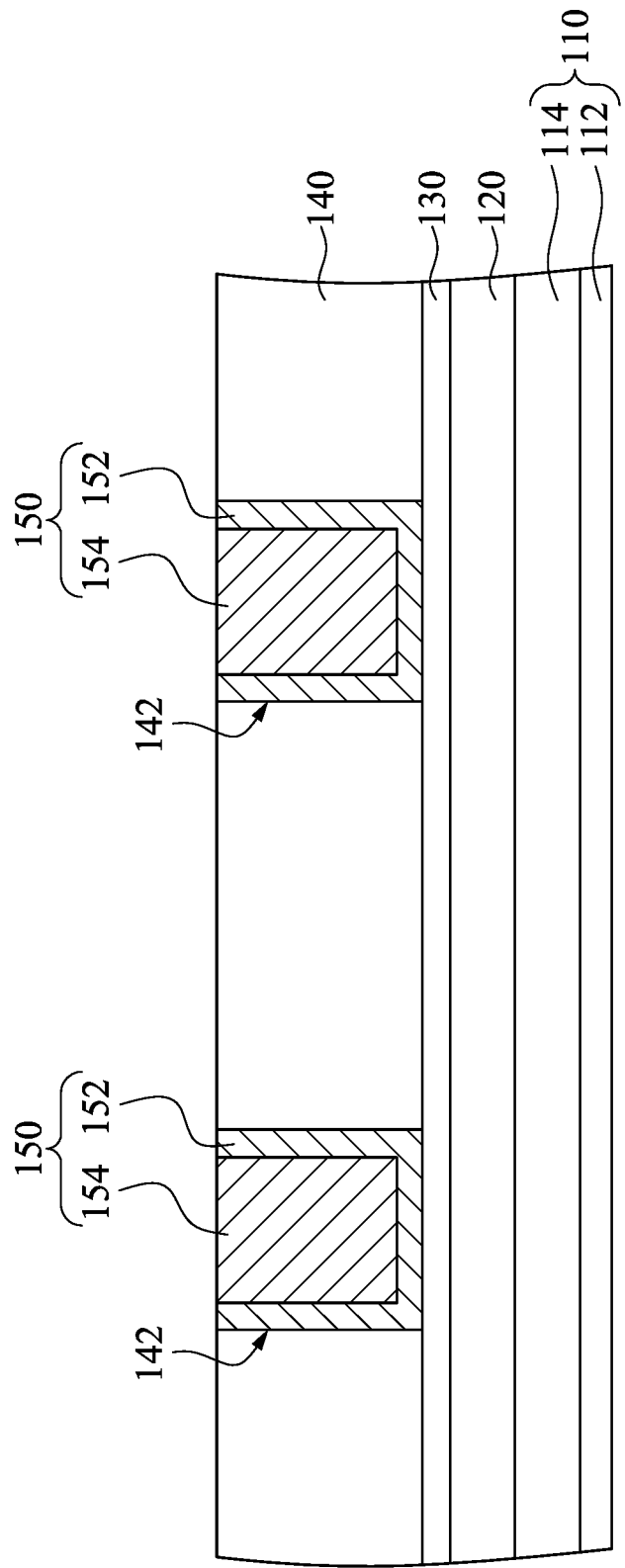

In operation S20 of method M10 in FIG. 2A, bottom electrodes 150 are respectively formed in the bottom electrode via openings 142, as shown in FIG. 5. In some embodiments, barrier layers 152 are conformally formed in the bottom electrode via openings 142. The barrier layers 152 can improve the adhesion between the bottom conductive line 130 and a material formed thereon (such as the filling materials 154), or prevent a diffusion of a metal from diffusing from the via into the first dielectric layer 140. The barrier layers 152 may include metal nitride materials. For example, the barrier layer 152 includes Ta, TaN, or other suitable materials. In some embodiments, the barrier layer 152 includes a single layer or multiple layers. For a multiple-layer configuration, the layers include different compositions of metal nitride from each other.

Filling materials 154 are respectively formed in the bottom electrode via openings 142 and over the barrier layers 152. The filling materials 154 are electrically connected to the bottom conductive line 130. In some embodiments, a blanket barrier layer and a filling layer are sequentially formed on the first dielectric layer 140 and in the bottom electrode via openings 142, and excessive portions of the filling layer and the blanket barrier layer are removed by performing a CMP process to form the filling materials 154 and the barrier layer 152. The filling materials 154 can be made of Ti, TiN, or other suitable materials. The filling material 154 and the barrier layer 152 are referred to as the bottom electrode 150.

Figure 6:
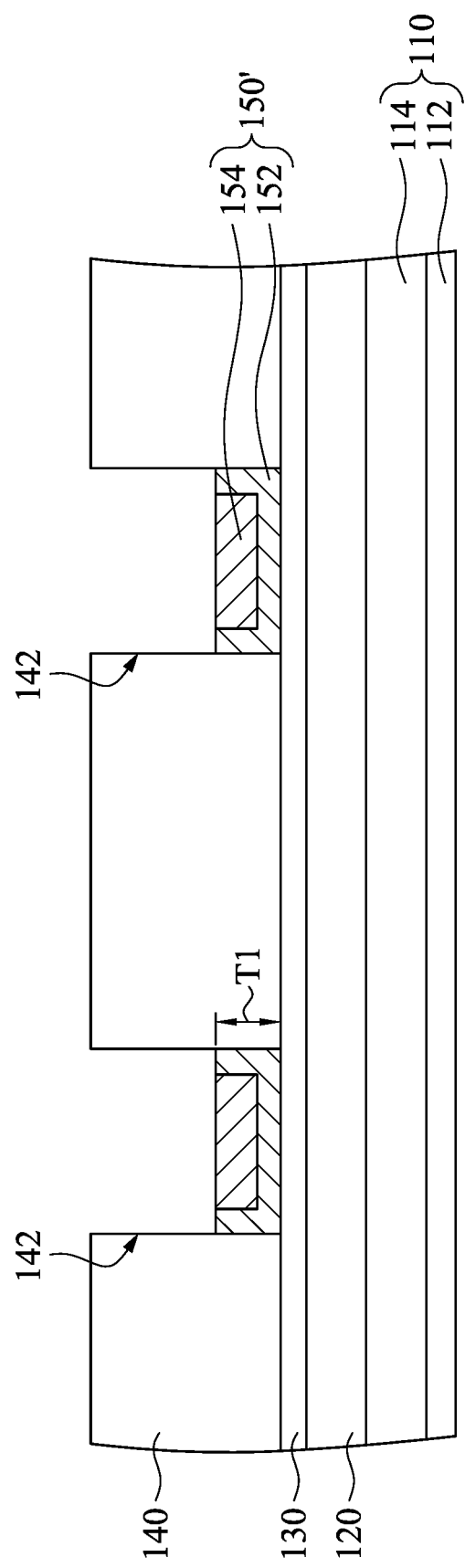

In operation S22 of method M10 in FIG. 2A, the bottom electrodes 150 are etched back, as shown in FIG. 6. Specifically, the bottom electrodes 150 may, in some embodiments, be etched to a predetermined depth by, for example, a selective etch. For example, in some embodiments, the bottom electrodes 150 may be etched back by performing an etching process such as dry etch, wet etch, or combinations thereof. In some embodiments, the bottom electrodes 150 may be etched back by about 70% to about 99% of the depth D1 of the bottom electrode via opening 142. That is, the etched back bottom electrode 150' has a thickness T1 is in a range of about 1 nm to about 30 nm. If the thickness T1 is less than about 1 nm, the bottom electrodes 150' may expose the bottom conductive line 130 and does not provide a good conductivity between the bottom conductive line 130 and the selector 165 (and/or the memory layer 185); if the thickness T1 is greater than about 30 nm, the bottom electrode via opening 142 may not have sufficient space to accommodate the selector 165 and the capping layer 175.

Figure 7:
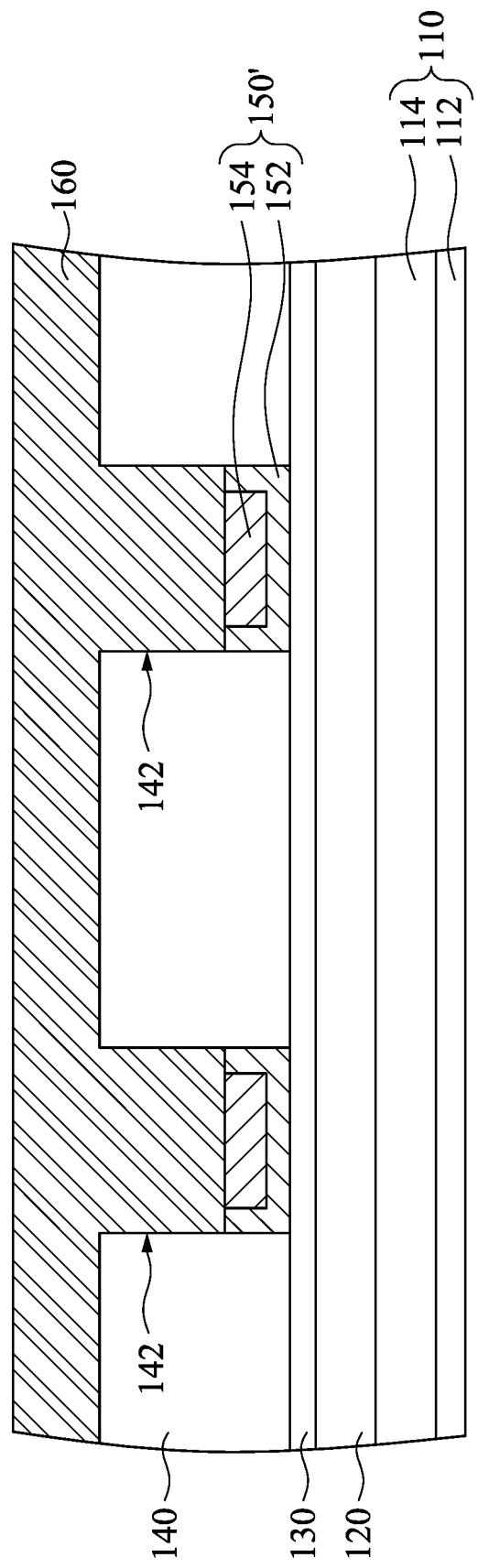

In operation S24 of method M10 in FIG. 2A, a selector layer 160 is formed over the bottom electrodes 150' and the first dielectric layer 140, as shown in FIG. 7. Specifically, the selector layer 160 may be deposited over the structure of FIG. 6 (i.e., over the first dielectric layer 140 and the bottom electrodes 150' and filling the remaining bottom electrode via openings 142). In some embodiments, the selector layer 160 may be deposited by physical vapor deposition (PVD), chemical vapor deposition (CVD), atomic layer deposition (ALD) process, or other suitable process(es).

In some embodiments, the selector layer 160 may be an ovonic threshold switch (OTS), which is a two-terminal symmetrical voltage sensitive switching device and may be characterized before it is used in a circuit device. The OTS mechanism includes in a switch between a high resistive (OFF state) at a low electric field and a low resistive state (ON state) when a specific voltage is obtained. As such, the OTS may allow for bidirectional switching and may be easily integrated as a select device for a memory device.

In some embodiments, the selector layer 160 may be a binary OTS material such as GeSe or BTe, a ternary OTS material such as GeSeN, GeSeSi, GeSeTe, or AsGeSe, a quaternary OTS material such as TeAsGeSe, SiAsGeSe, or SiGeAsTe, a quinary OTS material such as SiTeAsGeSe, STeAsGeSe, or BTeAsGeSe, a senary OTS material such as BSiTeAsGeSe, a septenary OTS material such as NBSi-TeAsGeSe, a octonary OTS material such as SNBSi-TeAsGeSe, or other suitable materials.

Figure 8:
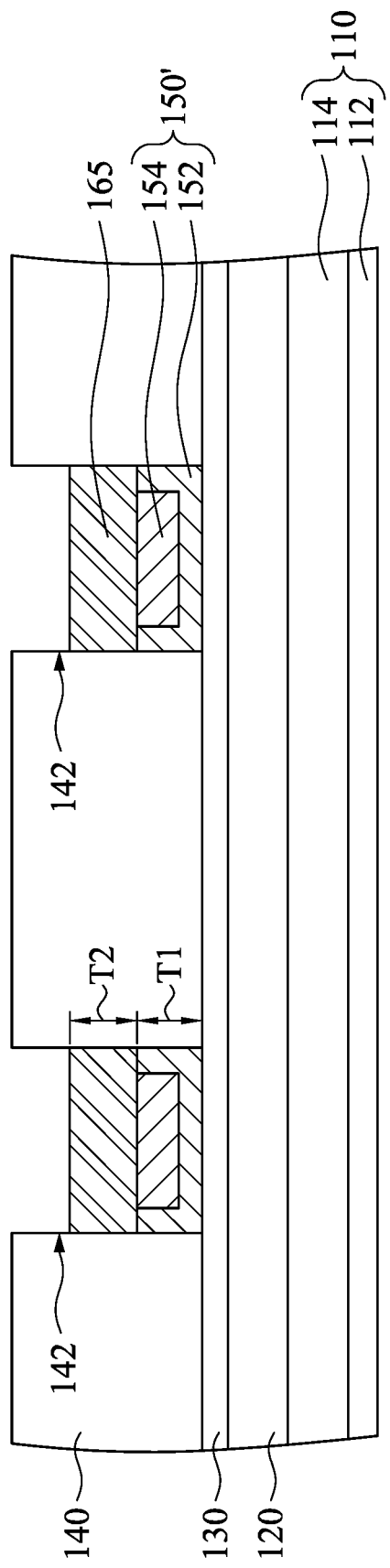

In operation S26 of method M10 in FIG. 2B, the selector layer 160 is etched back to form selectors 165 respectively in the bottom electrode via openings 142 and respectively over the bottom electrodes 150', as shown in FIG. 8. Specifically, the selector layer 160 may, in some embodiments, be etched to a predetermined depth by, for example, a selective etch. For example, in some embodiments, the selector layer 160 may be etched back by performing an etching process such as dry etch, wet etch, or combinations thereof. In some embodiments, the selector layer 160 may be etched back by about 1% to about 90% of the remaining depth of the bottom electrode via opening 142. That is, the selector 165 has a thickness T2 is in a range of about 5 nm to about 20 nm. If the thickness T2 is less than about 5 nm, the selectors 165 may have a current leakage problem; if the thickness T2 is greater than about 20 nm, the bottom electrode via opening 142 may not have sufficient space to accommodate the capping layer 175. The thickness T2 of the selector 165 may be greater than, substantially equal to, or less than the thickness T1 of the bottom electrode 150'.

Figure 9:
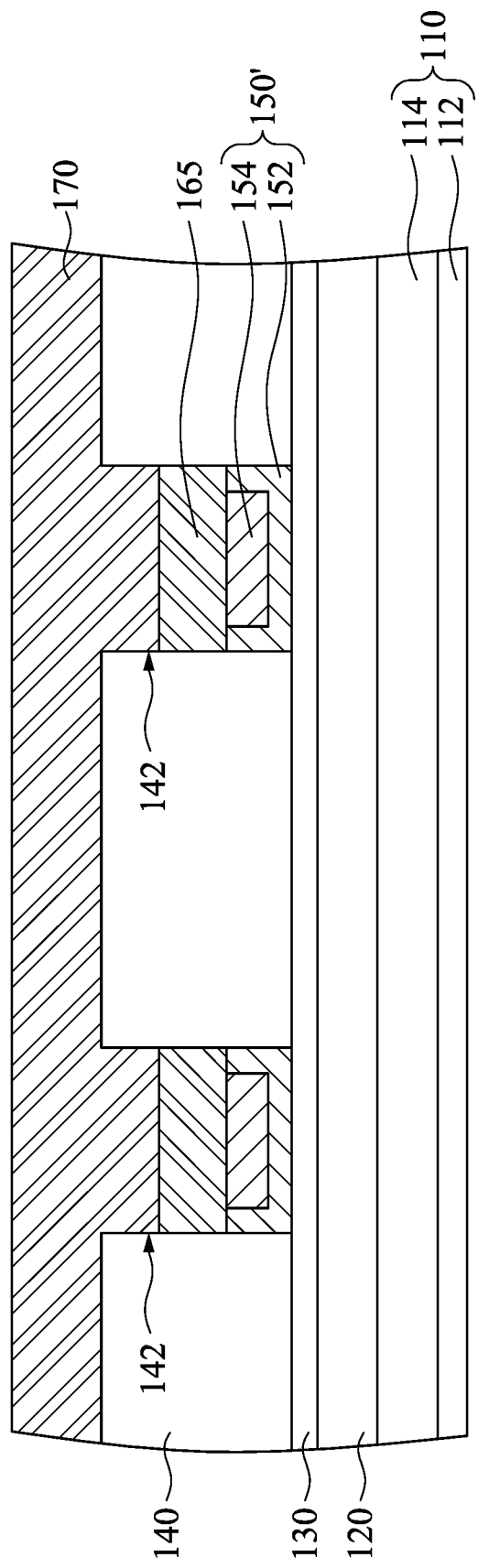

In operation S28 of method M10 in FIG. 2B, a capping material 170 is formed over the selectors 165 and the first dielectric layer 140, as shown in FIG. 9. Specifically, the capping material 170 may be deposited over the structure of FIG. 8 (i.e., over the first dielectric layer 140 and the selectors 165 and filling the remaining bottom electrode via openings 142). In some embodiments, the capping material 170 may be deposited by PVD, CVD, ALD process, or other suitable process(es). In some embodiments, the capping material 170 may be made of a metal nitride material such as TiN or other suitable materials.

Figure 10:
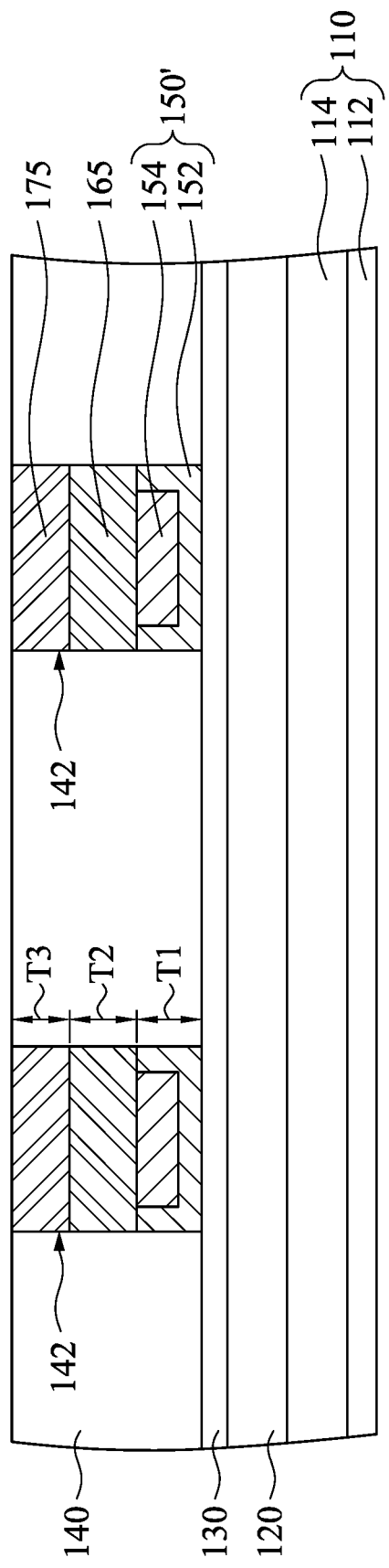

In operation S30 of method M10 in FIG. 2B, a portion of the capping material 170 (see FIG. 9) outside the bottom electrode via openings 142 is removed to form capping layers 175 respectively in the bottom electrode via openings 142 and respectively over the selectors 165, as shown in FIG. 10. In some embodiments, the portion of the capping material 170 disposed over the first dielectric layer 140 is polished away in a planarization process. The planarization process may include a chemical-mechanical-polishing (CMP) process, for example. In this case, the first dielectric layer 140 may serve as a polishing-stop layer for the planarization process.

In FIG. 10, since the capping layers 175 are formed substantially right after the formation of the selectors 165, the selectors 165 are sealed by the capping layers 175, the bottom electrodes 150', and the first dielectric layer 140. That is, the selectors 165 are isolated from the semiconductor manufacturing environment and not exposed in the environment. As such, the selectors 165 will not contaminate other materials (such as the following formed memory layers 185). In some embodiments, the capping layer 175 has a thickness T3 in a range of about 1 nm to about 94 nm. If the thickness T3 is less than about 1 nm, the capping layers 175 may not sufficiently cover the selectors 165, such that the selectors 165 may be exposed in the semiconductor manufacturing environment; the upper limit (94 nm) is determined by the thicknesses T1 and T2 of the bottom electrodes 150' and the selectors 165 (e.g., if the bottom electrode via opening 142 has a maximum depth D1 of about 100 nm, the bottom electrode 150' has a thickness T1 of about 1 nm, and the selector 165 has a thickness T2 of about 5 nm, the capping layer 175 cannot have a thickness T3 greater than about 94 nm).

Figure 11:
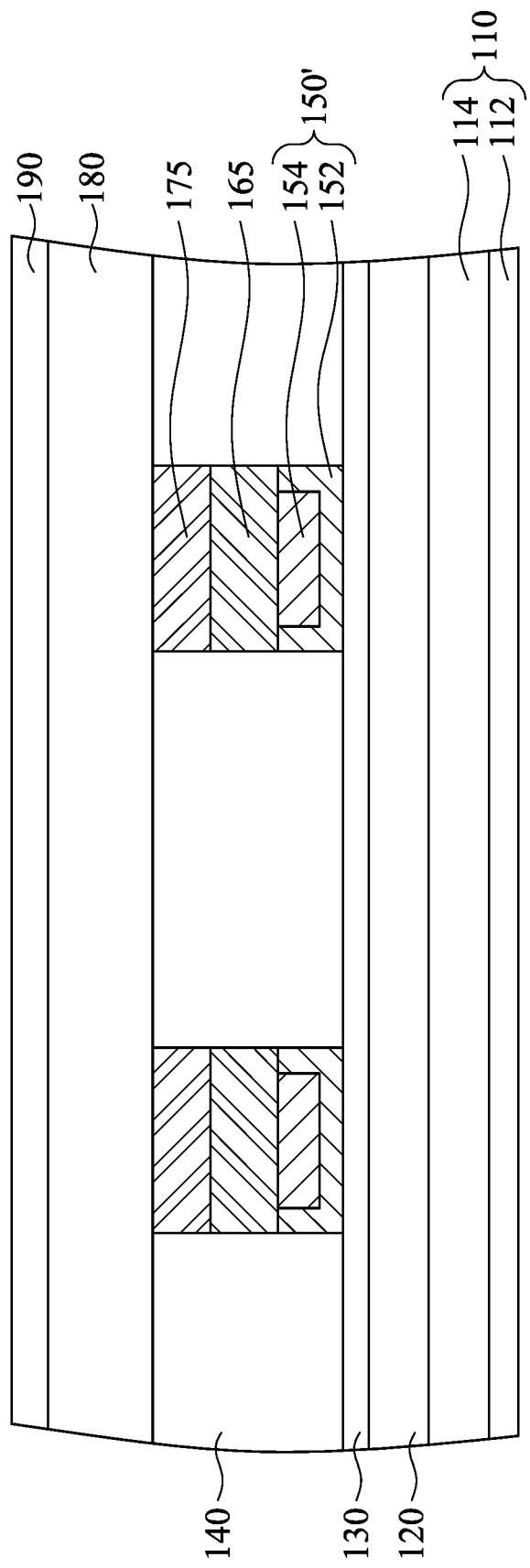
Figure 12:
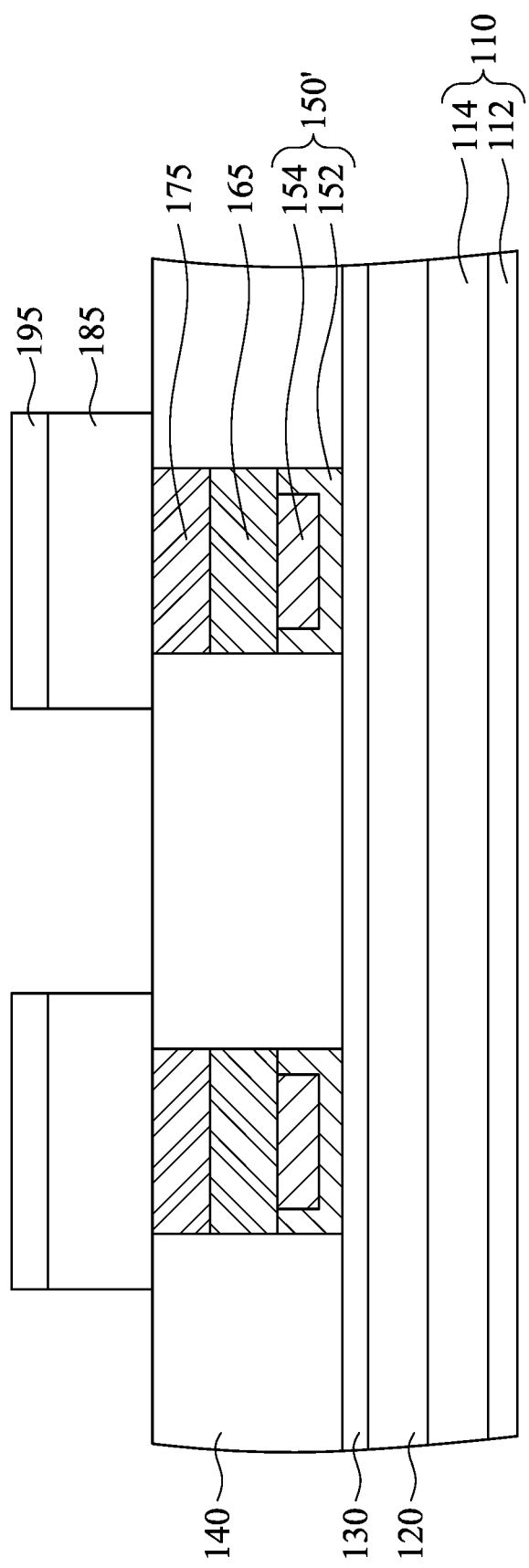

In operation S32 of method M10 in FIG. 2B, memory layers 185 and top electrodes 195 are formed over the capping layers 175 and the first dielectric layer 140, as shown in FIGS. 11 and 12. Specifically, in FIG. 11, a memory material layer 180 and a top electrode layer 190 are deposited sequentially over the structure of FIG. 10 (i.e., over the first dielectric layer 140 and the capping layers 175. In some embodiments, the memory device (see FIG. 1) includes RRAMs, and the memory material layer 180 of the RRAM may be a resistive material such as metal oxide, which may be hafnium oxide, zirconium oxide, aluminum oxide, nickel oxide, tantalum oxide, titanium oxide, and other suitable oxides used as a resistive material layer. The metal oxide may have a non-stoichiometric oxygen to metal ratio. Depending on the method of deposition, the oxygen to metal ratio and other process conditions may be tuned to achieve specific resistive material layer properties. For example, a set of conditions may yield a low 'forming' voltage and another set of conditions may yield a low 'read' voltage. The metal oxide may be deposited. In some embodiments, the metal oxide is a transition metal oxide. In other embodiments, the resistive material layer is a metal oxynitride. The memory material layer 180 may have a thickness ranging between about 2 nm and about 10 nm. Thicker memory material layer 180 result in higher forming voltage. However, a thin memory material layer 180 may be susceptible to current leakage if over etched and is more sensitivity to surface and thickness non-uniformity.

In some embodiments, the memory device (see FIG. 1) includes PCRAMs, and the memory material layer 180 of the PCRAM may be chalcogenide alloy such as GeSbTe (GST). Alternatively, the memory material layer 180 may include Si—Sb—Te alloys, Ga—Sb—Te alloys, As—Sb—Te alloys, Ag—In—Sb—Te alloys, Ge—In—Sb—Te alloys, Ge—Sb alloys, Sb—Te alloys, Si—Sb alloys, or combinations thereof. The phase change materials have a crystalline state with a low resistivity, and an amorphous state with a high resistivity. In some embodiments, the thickness of the memory material layer 180 is in a range of about 10 nm to about 50 nm.

In some embodiments, the memory device (see FIG. 1) includes MRAMs, and the memory material layer 180 of the MRAM may be (a) magnetic tunnel junction (MTJ) layer(s). The MTJ layer(s) may include various layers formed of different combinations of materials. In some embodiments, the MTJ layer(s) include a pinning layer, a tunnel barrier layer, and a free layer. In addition, the MTJ layer(s) may have other variations including other layers, such as anti-ferro-magnetic layers. In some embodiments, the pinning layer is formed of PtMn, the tunnel barrier layer is formed of MgO, and the free layer is formed of CoFeB. The magnetic moment of the free layer may be programmed causing the resistance of the resulting MTJ cell to be changed between a high resistance and a low resistance. It is realized that MTJ layer(s) may have many variations, which are also within the scope of the present disclosure.

The memory material layer 180 may be formed by a suitable technique, such as atomic layer deposition (ALD). Other chemical vapor deposition (CVD) techniques may be used. In another example, the memory material layer 180 may be formed by a physical vapor deposition (PVD), such as a sputtering process with a metallic target and with a gas supply to the PVD chamber. In yet another example, the memory material layer 180 may be formed by an electron-beam deposition process.

The top electrode layer 190 may be metal, metal-nitride (e.g., TiN), doped polysilicon, other suitable conductive material, combinations thereof, or the like. For example, the top electrode layer 190 may be tantalum nitride, titanium nitride, platinum, other suitable metal, combinations thereof, or the like. The top electrode layer 190 may be formed by PVD, CVD including ALD, or other suitable technique and has a thickness in a range of about 5 nm to about 30 nm.

Reference is made to FIG. 12. Next, the memory material layer 180 and the top electrode layer 190 are patterned to respectively form memory layers 185 and top electrodes 195 stacked in sequence. The patterning includes a photolithography operation where a photoresist is deposited, a pattern is defined by exposing photoresist to a radiation, and developing the photoresist to create a photoresist pattern. The photoresist pattern is then used as an etch mask to protect desired portions of the memory material layer 180 and the top electrode layer 190. The etch process stops when the first dielectric layer 140 is reached. The memory layers 185 are respectively connected to the selectors 165 through the capping layers 175.

Figure 13:
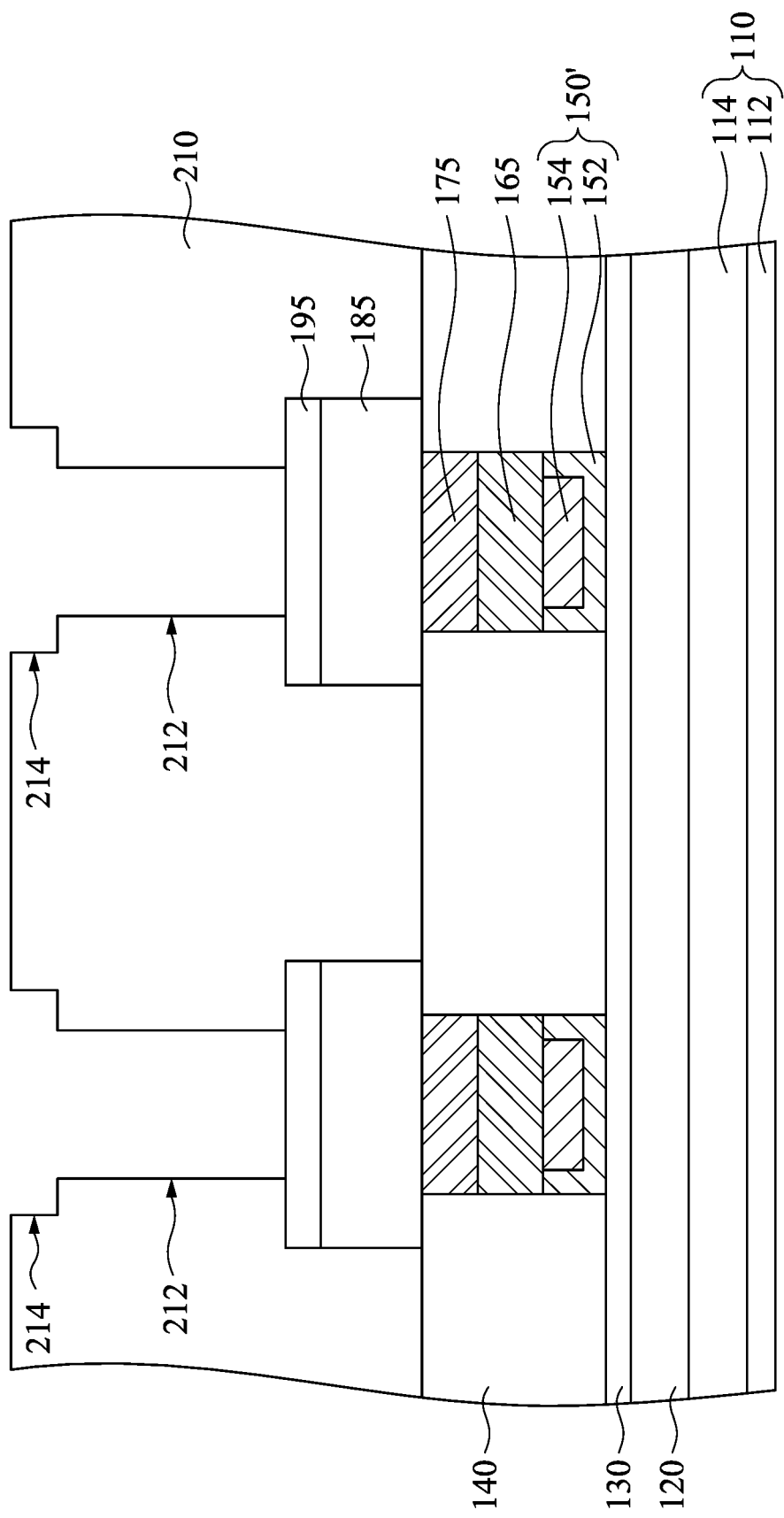
Figure 14:
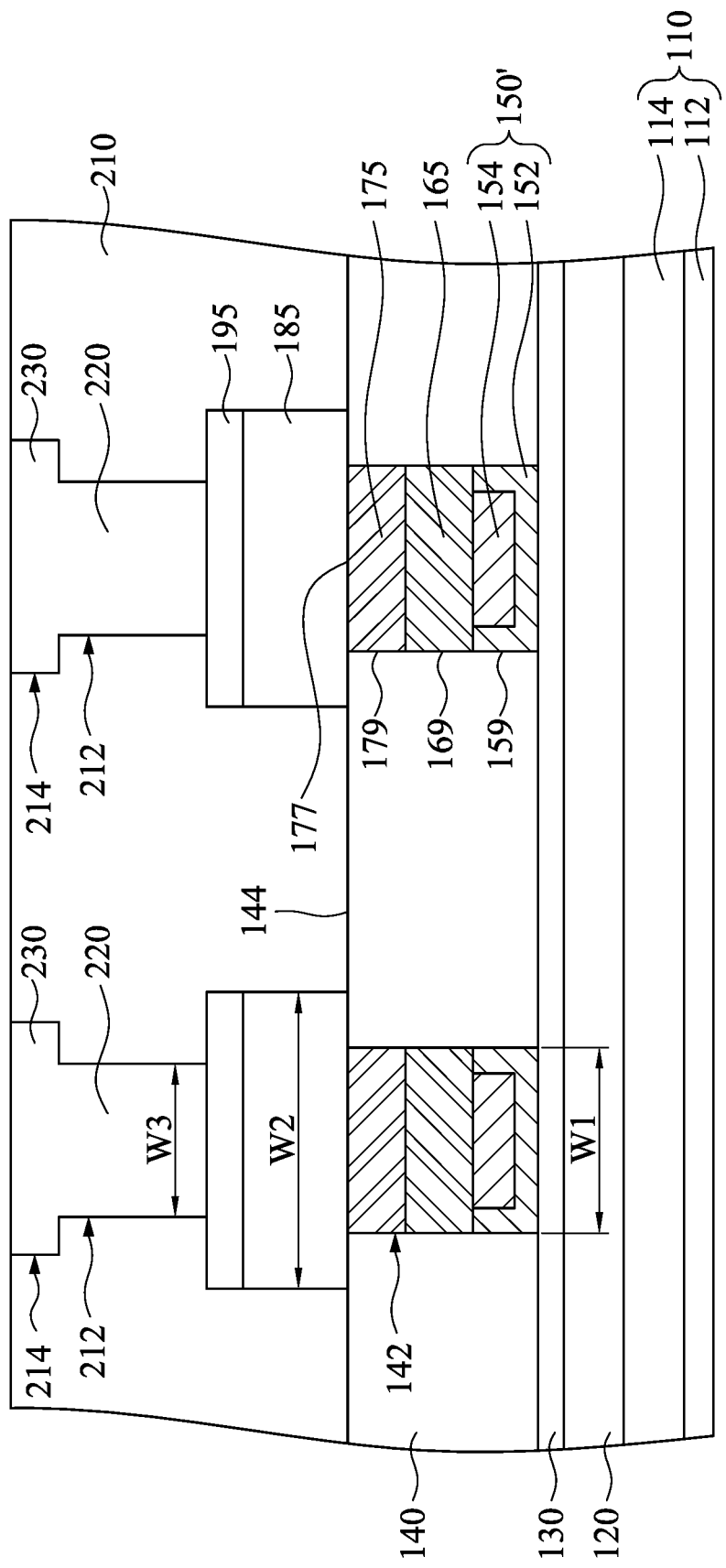

In operation S34 of method M10 in FIG. 2B, second dielectric layer 210 used as the top via structure and top conductive lines 230 are formed over the top electrodes 195, as shown in FIGS. 13 and 14. Specifically, a second dielectric layer 210 is deposited over the structure of FIG. 12 (i.e., over the top electrodes 195 and the first dielectric layer 140). The second dielectric layer 210 may include the same material as the first dielectric layer 140 in some embodiments. The second dielectric layer 210 may include, for example, silicon oxide, low-k silicon oxide such as a porous silicon oxide layer, other suitable dielectric material, combinations thereof, or the like.

In some embodiments, a dual-damascene process is performed on the second dielectric layer 210. Specifically, a plurality of top via openings 212 are formed in the second dielectric layer 210, then a plurality of top line openings 214 are formed in the second dielectric layer 210, as shown in FIG. 13. In some other embodiments, however, the top line openings 214 may be formed before the formation of the top via openings 212. After the formation, the top via openings 212 respectively expose the top electrodes 195.

Reference is made to FIG. 14. Filling material is formed in the top via openings 212 and the top line openings 214. The filling material is electrically connected to the top electrodes 195. Then, excessive portion of the filling material is removed by performing a CMP process to form top conductive lines 230 respectively in the top line openings 214 and top vias 220 respectively in the top via openings 212. The filling material may have similar or the same material as the bottom conductive lines 130.

In FIG. 14, the first dielectric layer 140 surrounds the bottom electrodes 150', the selectors 165, and the capping layers 175. A top surface 177 of the capping layer 175 and a top surface 144 of the first dielectric layer 140 are substantially coplanar. Furthermore, the first dielectric layer 140 is in contact with sidewalls 179 of the capping layers 175, sidewalls 169 of the selectors 165, and sidewalls 159 of the bottom electrodes 150'. The sidewall 179 of the capping layers 175, the sidewall 169 of the selectors 165, and the sidewall 159 of the bottom electrodes 150' are coterminous.

In FIG. 14, the bottom electrode via opening 142 has a width W1, which is substantially the width of the bottom electrode 150', the width of the selector 165, and/or the width of the capping layer 175. In some embodiments, the width W1 is in a range of about 10 nm to about 90 nm, e.g., about 40 nm. If the width W1 is less than about 10 nm, the bottom electrode via opening 142 may not reach the top surface of the bottom conductive line 130, or the bottom electrode 150' may not be in contact with the bottom conductive line 130; if the width W1 is greater than about 90 nm, the current applied to the memory layer 185 may be increased. The memory layer 185 (and the top electrode 195) has a width W2. In some embodiments, the width W2 is in a range of about 10 nm to about 300 nm, e.g., about 100 nm. If the width W2 is less than about 10 nm, the critical dimensions of the memory layers 185 (the top electrodes 195) may have high variations, e.g., the memory layers 185 (the top electrodes 195) may have different sizes; if the width W2 is greater than about 300 nm, the layout area of the memory device is undesirably increased. The top via 220 has a width W3. In some embodiments, the width W3 is in a range of about 10 nm to about 90 nm, e.g., about 70 nm. If the width W3 is less than about 10 nm, the top via opening 212 may not reach the top surface of the top electrode 195, or the top via 220 may not fill the top via opening 212; if the width W3 is greater than about 90 nm, a tiger tooth may be formed around the top electrode 195 if the top via opening 212 is misaligned with the top electrode 195.

Figure 15:
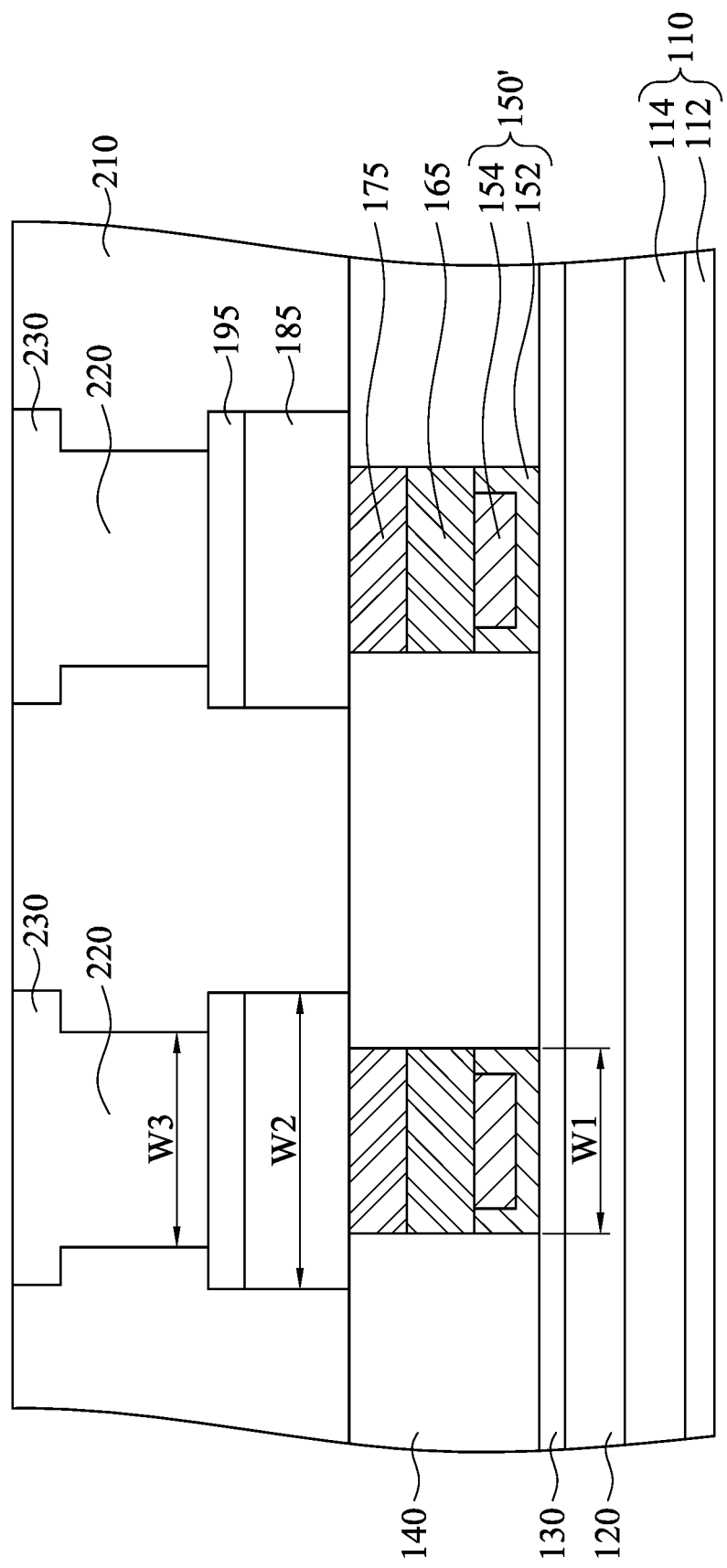
FIGS. 15, 16, and 17 are cross-sectional views of memory devices according to some embodiments.
Figure 16:
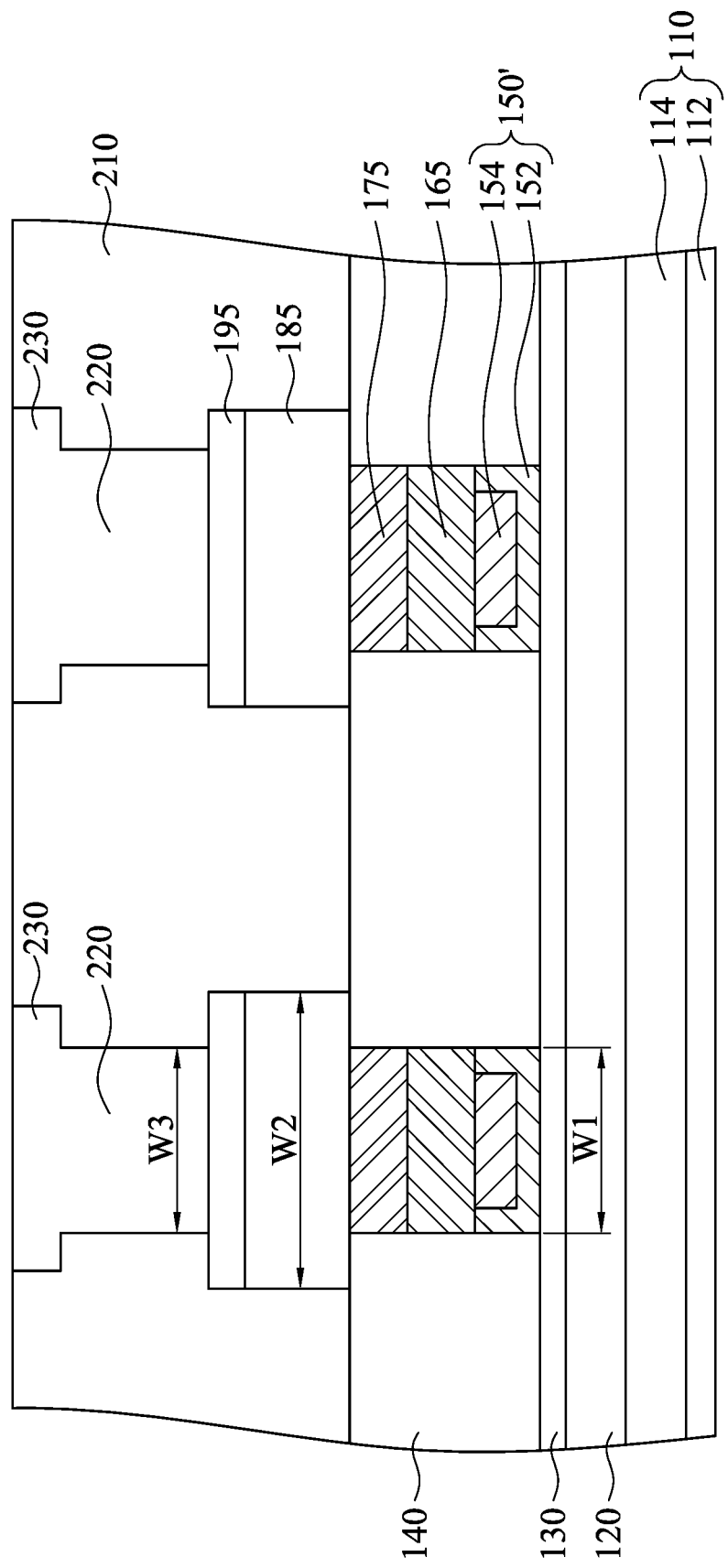
Figure 17:
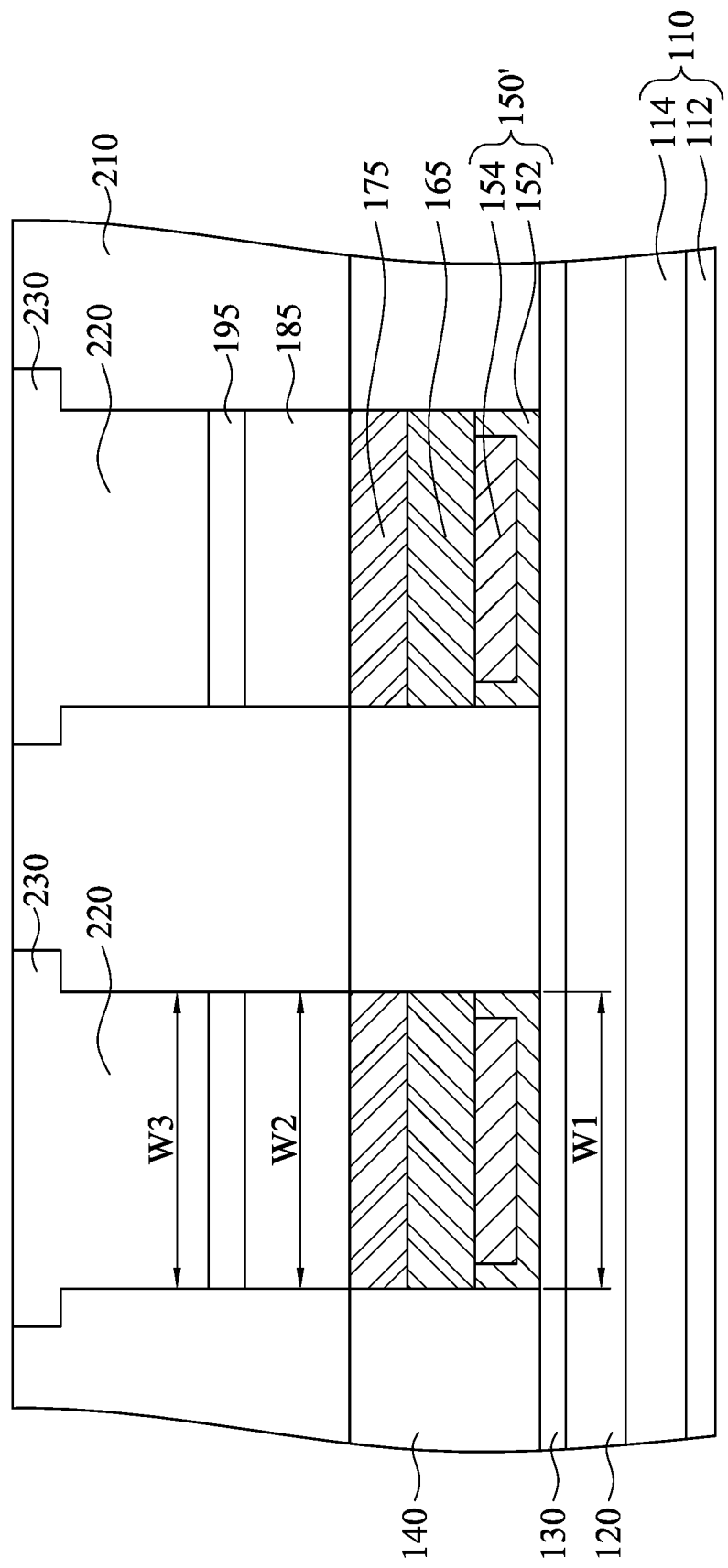

In FIG. 14, the width W2 is greater than the width W1 and the width W3, and the width W1 is greater than the width W3. For example, the memory layer 185 is in contact with the capping layer 175 and the first dielectric layer 140. In some other embodiments, however, the widths W1, W2, and W3 satisfy other relationships. FIGS. 15, 16, and 17 are cross-sectional views of memory devices according to some embodiments. In FIG. 15, the width W2 is greater than the width W1 and the width W3, and the width W3 is greater than the width W1. In FIG. 16, the width W2 is greater than the width W1 and the width W3, and the widths W1 and W3 are substantially the same.

In FIG. 17, the widths W1, W2, and W3 are substantially the same. In some other embodiments, the widths W2 and W3 are substantially the same, and the width W2 is greater than the width W1. In still some other embodiments, the widths W2 and W1 are substantially the same, and the width W2 is greater than the width W3. Embodiments fall within the present disclosure if the width W2 is greater than or substantially than the width W1 (W3).

Figure 18:
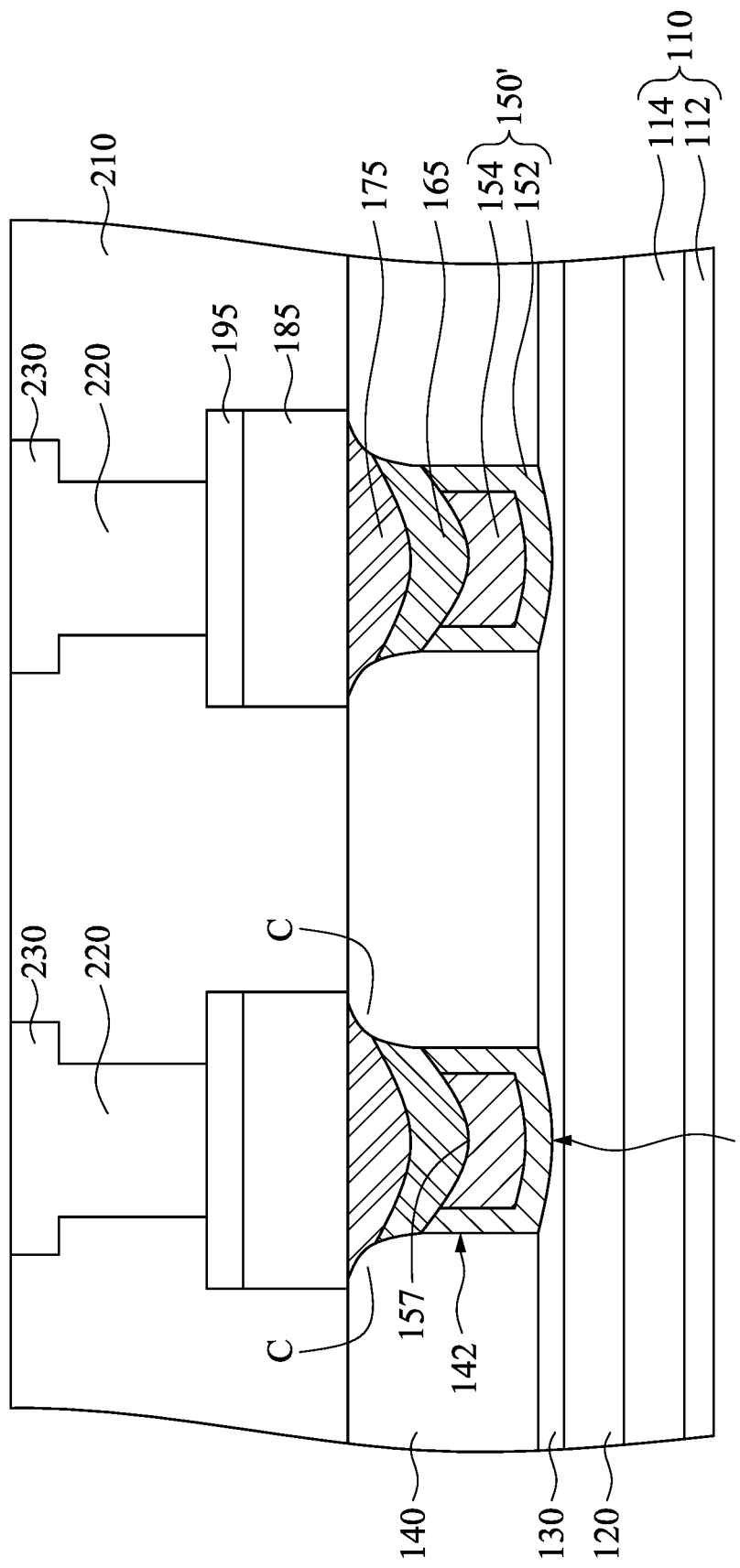
FIG. 18 is a cross-sectional view of a memory device according to some embodiments.

FIG. 18 is a cross-sectional view of a memory device according to some embodiments. The difference between the memory devices in FIGS. 18 and 14 is that the shape of the bottom electrode via opening 142 (and the bottom electrode 150', the selector 165, and the capping layer 175). In FIG. 18, during the operation of S18 of FIG. 2A, the bottom electrode via opening 142 may be overetched. As such, a portion of the bottom conductive line 130 may be removed to form a recess R therein, and a portion of the bottom electrode 150' is formed in the recess R. Furthermore, during the operation S22 of FIG. 2A, depending on the etchant used in the etching back process, a top surface 157 of the bottom electrode 150' (and a bottom surface of the selector 165) may be curved. In FIG. 18, the top surface 157 may be concaved, and the present disclosure is not limited in this respect. Also, in the operations S22 and/or S26, the etching back process may remove some portion of the first dielectric layer 140, such that the first dielectric layer 140 may have round corners C around the top of the bottom electrode via opening 142. With this configuration, a width of the capping layer 175 may be greater than a width of the bottom electrode 150'. Other relevant structural details of the memory device of FIG. 18 are similar to the memory device of FIG. 14, and, therefore, a description in this regard will not be repeated hereinafter.

According to some embodiments, since the selector has a small size and is surrounded by the first dielectric layer, the heat generated by the selector is confined therein and does not easy to be dissipated by the first dielectric layer. As such, the threshold voltage for the memory operation can be reduced. Furthermore, since the capping layer is formed substantially right after the formation of the selector, the selector is sealed by the capping layer, the bottom electrode, and the first dielectric layer. That is, the selector is isolated from the semiconductor manufacturing environment and not exposed in the environment. As such, this configuration prevents selector material contamination in the semiconductor manufacturing environment.

According to some embodiments, a method for manufacturing a memory device includes forming a dielectric layer over a substrate. A bottom electrode via opening is formed in the dielectric layer. A bottom electrode is formed in the bottom electrode via opening. The bottom electrode is etched back. A selector is formed in the bottom electrode via opening and over the bottom electrode. A memory layer is formed over the selector. A top electrode is formed over the memory layer.

According to some embodiments, a method for manufacturing a memory device includes forming a bottom conductive line over a substrate. A dielectric layer is formed over the bottom conductive line and the substrate. A bottom electrode via opening is formed in the dielectric layer to expose the bottom conductive line. A selector is formed in the bottom electrode via opening and over the bottom conductive line. A memory layer is formed over the selector. A top conductive line is formed over the memory layer.

According to some embodiments, a memory device includes a bottom electrode, a selector, a memory layer, and a top electrode. The selector is formed over the bottom electrode. A sidewall of the bottom electrode and a sidewall of the selector are coterminous. The memory layer is formed over the selector. A top electrode is formed over the memory layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a memory device comprising:
    forming a dielectric layer over a substrate;
    forming a bottom electrode via opening in the dielectric layer;
    forming a bottom electrode in the bottom electrode via opening;
    etching back the bottom electrode, wherein a bottom surface of the bottom electrode is substantially coplanar with a bottom surface of the dielectric layer;
    forming a selector in the bottom electrode via opening and over and in direct contact with the bottom electrode;
    forming a capping layer in the bottom electrode via opening and over and in direct contact with the selector, wherein a sidewall of the bottom electrode, a sidewall of the selector, and a sidewall of the capping layer are coplanar, wherein forming the capping layer comprises:
        depositing a capping material in the bottom electrode via opening and over the dielectric layer; and
        planarizing the capping material with a top surface of the dielectric layer to form the capping layer in the bottom electrode via opening;
    forming a memory material layer over and in direct contact with the planarized capping layer;
    forming a top electrode layer over the memory material layer; and
    etching the top electrode layer and the memory material layer to form a memory layer over the capping layer and a top electrode over the memory layer, wherein an entire of a top surface of the memory layer is wider than an entire of a top surface of the capping layer, and the memory layer is in direct contact with the top surface of the capping layer.

2. The method of claim 1, further comprising:
forming a top via over the top electrode layer; and
forming a top conductive line over the top via, wherein a sidewall of the top conductive line is misaligned with a sidewall of the top via.

3. The method of claim 1, further comprising forming a bottom conductive line over the substrate before forming the dielectric layer, wherein the bottom electrode is in direct contact with the bottom conductive line.

4. The method of claim 1, wherein the selector is an ovonic threshold switch (OTS).

5. A method for manufacturing a memory device comprising:
forming a bottom conductive line over a substrate;
after forming the bottom conductive line over the substrate, forming a dielectric layer over the bottom conductive line and the substrate, wherein the dielectric layer is in direct contact with a sidewall of the bottom conductive line;
forming a bottom electrode via opening in the dielectric layer to expose an inner sidewall of the dielectric layer and the bottom conductive line;
forming a selector in the bottom electrode via opening, in direct contact with the inner sidewall of the dielectric layer, and over the bottom conductive line, wherein after forming the selector in the bottom electrode via opening, the dielectric layer is a single piece of continuous material and in direct contact with both the selector and the sidewall of the bottom conductive line;
forming a memory layer over the selector such that a bottommost portion of the memory layer is above a top surface of the dielectric layer; and
forming a top conductive line over the memory layer.

6. The method of claim 5, further comprising forming a bottom electrode over the bottom conductive line, and the selector is formed over the bottom electrode and separated from the bottom conductive line by the bottom electrode, wherein a width of the bottom conductive line is greater than a width of the bottom electrode.

7. The method of claim 5, further comprising forming a top electrode over the memory layer, and the top conductive line is formed over the top electrode.

8. The method of claim 5, further comprising forming a capping layer over the selector and in direct contact with the inner sidewall of the dielectric layer, wherein an outer sidewall of the capping layer is aligned with an outer sidewall of the selector, the memory layer is formed over the capping layer, and a top surface of the capping layer is substantially coplanar with a top surface of the dielectric layer.

9. The method of claim 8, wherein the capping layer is entirely formed in the bottom electrode via opening.

10. A method for manufacturing a memory device comprising:
forming a bottom electrode in a bottom electrode via opening in a first dielectric layer;
forming a selector above the bottom electrode and in the first dielectric layer, wherein a maximum width of the selector is substantially equal to a maximum width of the bottom electrode;
forming a capping layer above the selector and in the first dielectric layer, wherein a sidewall of the bottom electrode, a sidewall of the selector, and a sidewall of the capping layer are coplanar, wherein forming the capping layer comprises:
depositing a capping material in the bottom electrode via opening and over the first dielectric layer; and
planarizing the capping material with a top surface of the first dielectric layer to form the capping layer in the bottom electrode via opening;
forming a memory material layer above and in direct contact with the planarized capping layer and the first dielectric layer;
etching the memory material layer to form a memory layer above the capping layer and the first dielectric layer, wherein a portion of the memory layer is directly above the first dielectric layer, such that a top surface of the capping layer, a top surface of the first dielectric layer, and a bottom surface of the memory layer are substantially coplanar;
forming a second dielectric layer above the first dielectric layer and the memory layer; and
forming a top via in the second dielectric layer and above the memory layer.

11. The method of claim 10, wherein the selector is an ovonic threshold switch (OTS).

12. The method of claim 10, wherein the capping layer is formed such that an interface between the capping layer and the first dielectric layer and an interface between the selector and the first dielectric layer are coterminous.

13. The method of claim 10, wherein the capping layer is made of metal nitride material.

14. The method of claim 10, further comprising forming a top electrode above the memory material layer before forming the second dielectric layer.

15. The method of claim 14, wherein forming the memory material layer and the top electrode is such that the top electrode is in direct contact with the memory material layer.

16. The method of claim 10, wherein forming the bottom electrode comprises:
conformally forming a barrier layer in the first dielectric layer;
forming a filling material above the barrier layer and in the first dielectric layer;
performing a planarization process to the barrier layer and the filling material; and
after performing the planarization process to the barrier layer and the filling material, etching back the barrier layer and the filling material.

17. The method of claim 1, wherein forming the memory material layer is such that the memory material layer is in direct contact with the dielectric layer, and the dielectric layer is a single piece of continuous material.

18. The method of claim 10, wherein the top via is formed after forming the second dielectric layer above the first dielectric layer and the memory layer.

19. The method of claim 10, wherein the second dielectric layer laterally surrounds the memory layer.

20. The method of claim 1, wherein forming the memory material layer is such that a first portion of the memory material layer is in direct contact with the planarized capping layer, a second portion and a third portion of the memory material layer are in direct contact with the top surface of the dielectric layer, and
wherein etching the top electrode layer and the memory material layer comprises removing the third portion of the memory material layer such that the first portion and the second portion of the memory material layer form the memory layer.

* * * * *